(12) United States Patent
Yin et al.

(10) Patent No.: US 11,930,595 B2
(45) Date of Patent: Mar. 12, 2024

(54) CIRCUIT MATERIAL AND CIRCUIT BOARD CONTAINING THE SAME

(71) Applicant: Shengyi Technology Co., Ltd., Guangdong (CN)

(72) Inventors: Weifeng Yin, Guangdong (CN); Cui Huo, Guangdong (CN); Rui Liu, Guangdong (CN); Yongjing Xu, Guangdong (CN); Shanyin Yan, Guangdong (CN)

(73) Assignee: Shengyi Technology Co., Ltd., Guangdong (CN)

( * ) Notice: Subject to any disclaimer, the term of this patent is extended or adjusted under 35 U.S.C. 154(b) by 377 days.

(21) Appl. No.: 17/162,122

(22) Filed: Jan. 29, 2021

(65) Prior Publication Data

US 2021/0307164 A1    Sep. 30, 2021

(30) Foreign Application Priority Data

Mar. 30, 2020   (CN) ......................... 202010239479.X

(51) Int. Cl.
| | |
|---|---|
| H05K 1/03 | (2006.01) |
| C09J 11/06 | (2006.01) |
| C09J 153/02 | (2006.01) |
| C09J 171/12 | (2006.01) |
| C09J 179/08 | (2006.01) |

(52) U.S. Cl.
CPC ............ H05K 1/0373 (2013.01); C09J 11/06 (2013.01); C09J 153/02 (2013.01); C09J 171/12 (2013.01); C09J 179/085 (2013.01); *C09J 2203/326* (2013.01); *H05K 2201/0158* (2013.01); *H05K 2201/0195* (2013.01)

(58) Field of Classification Search
CPC ....... C08G 65/485; C08L 71/126; C08L 9/06; C09J 11/06; C09J 153/02; C09J 171/12; C09J 179/085; C09J 2203/326; H05K 1/0373; H05K 2201/012; H05K 2201/0158; H05K 2201/0195; H05K 2201/0209; H05K 3/386
See application file for complete search history.

(56) References Cited

U.S. PATENT DOCUMENTS

| | | | | |
|---|---|---|---|---|
| 4,320,038 A | * | 3/1982 | Keogh ...................... | C08K 9/04 428/379 |
| 4,522,957 A | * | 6/1985 | Ashley ...................... | B29B 9/16 525/387 |
| 4,786,671 A | * | 11/1988 | Kress ...................... | C08L 55/02 524/508 |
| 5,223,568 A | | 6/1993 | Landi et al. | |
| 5,401,787 A | * | 3/1995 | Tonyali ................ | C08K 5/1539 524/412 |
| 5,409,996 A | * | 4/1995 | Shinohara .............. | C08G 61/08 525/189 |
| 5,571,609 A | | 11/1996 | St. Lawrence et al. | |
| 6,048,807 A | | 4/2000 | Landi | |
| 6,455,784 B1 | * | 9/2002 | Kinoshita ................ | H05K 3/20 428/209 |
| 2003/0008147 A1 | * | 1/2003 | Tamura ................ | B32B 27/308 428/407 |
| 2007/0203308 A1 | * | 8/2007 | Mori .................. | C08G 59/4014 523/466 |
| 2009/0050355 A1 | * | 2/2009 | Chun ...................... | B32B 15/08 428/416 |
| 2009/0247032 A1 | * | 10/2009 | Mori ..................... | C08L 71/126 428/457 |
| 2011/0014453 A1 | * | 1/2011 | Ohigashi .............. | H05K 3/4655 156/154 |
| 2018/0037736 A1 | * | 2/2018 | Zeng ....................... | C08L 47/00 |
| 2018/0258324 A1 | * | 9/2018 | Tochihira ............. | B32B 27/286 |

FOREIGN PATENT DOCUMENTS

| | | | |
|---|---|---|---|
| CN | 104725828 A | | 6/2015 |
| CN | 109438960 A | * | 3/2019 |
| CN | 109438960 A | | 3/2019 |
| CN | 110615876 A | | 12/2019 |
| JP | 2019006879 A | | 1/2019 |

OTHER PUBLICATIONS

Office Action dated May 6, 2021 by the CIPO in the corresponding Patent Application No. 202010239479.X, with English translation.
Europena Search Report issued in corresponsing application No. 21153760.0-1107.

* cited by examiner

*Primary Examiner* — William H. Mayo, III
*Assistant Examiner* — Rhadames Alonzo Miller
(74) *Attorney, Agent, or Firm* — Norton Rose Fulbright US LLP; James R. Crawford

(57) ABSTRACT

The present application provides a circuit material and a circuit board containing the same. The circuit material comprises a conductive metal layer and a dielectric substrate layer, and an adhesive layer arranged therebetween, wherein the adhesive layer is made of a material which comprises an adhesive composition comprising a resin component and a non-resin component, wherein the resin component is composed of unsaturated polyphenylene ether resin, SBS resin and maleimide resin; and the non-resin component comprises an initiator; and the adhesive layer is obtained by applying the adhesive composition dissolved in a solvent onto the surface of the conductive metal layer or the dielectric substrate layer in the form of a solution, or by applying to a release material and removing the release material after partially curing or completely curing.

16 Claims, No Drawings

CIRCUIT MATERIAL AND CIRCUIT BOARD CONTAINING THE SAME

CROSS-REFERENCE TO RELATED APPLICATION(S)

The present disclosure claims priority to a Chinese patent application No. CN 202010239479.X, filed on Mar. 30, 2020 to the CNIPA, the contents of which are incorporated by reference herein in its entirety.

TECHNICAL FIELD

The present application belongs to the technical field of printed circuit boards, and particularly relates to a circuit material and a circuit board containing the same.

BACKGROUND

With the development of high-performance, high-functionality, and networking of communication equipment such as computers and mobile phones in recent years, operating signals are becoming high-frequency in order to transmit and process large-capacity information at high speeds. High-performance electrical insulation materials suitable for high-frequency signal transmission are required.

In high-frequency circuits, electrical signal transmission loss is expressed by the sum of dielectric loss, conductor loss, and radiation loss. The higher the frequency of the electrical signal is, the greater the dielectric loss, conductor loss, and radiation loss are.

Transmission loss will attenuate the electrical signal and destroy the reliability of the electrical signal. At the same time, the loss will radiate from the high-frequency circuit, which may cause the failure of electronic equipment. Therefore, the dielectric loss, conductor loss and radiation loss must be reduced. The dielectric loss of the electrical signal is proportional to the product of the dielectric loss tangent of the insulator forming the circuit and the frequency of the electrical signal used. Therefore, the dielectric loss can be suppressed by selecting an insulating material with a small dielectric loss tangent.

U.S. Pat. No. 5,223,568A discloses a board made of polybutadiene, polyisoprene, and a thermoplastic elastomer. Although the prepared board has low loss, the board has the disadvantages of low peel strength, high curing temperature, and high energy consumption.

U.S. Pat. No. 5,571,609A discloses a board made of unsaturated polybutadiene resin, unsaturated olefin resin and a filler. The board is not sticky and has good manufacturability. However, the board contains a large amount of fillers, and has low peel strength and high dielectric loss.

U.S. Pat. No. 6,048,807A discloses a high-frequency copper clad laminate prepared by using unsaturated polybutadiene, cyclized olefin resin and fillers. The prepared board has low dielectric loss and is not sticky. It also uses a large amount of fillers to prepare. The board has low peel strength, low bending strength and high dielectric loss.

Therefore, it is desired in the art to obtain a circuit board with high peel strength and low dielectric loss.

SUMMARY

The present application provides a circuit material and a circuit board containing the same. The adhesive layer used in the present application has good film-forming properties, adhesion and dielectric properties, and the provided circuit material has higher interlayer peel strength and lower dielectric loss.

In a first aspect, the present application provides a circuit material comprising a conductive metal layer and a dielectric substrate layer, and an adhesive layer arranged between the conductive metal layer and the dielectric substrate layer,
wherein the adhesive layer is made of a material which comprises an adhesive composition; wherein the adhesive composition comprises a resin component and a non-resin component;
wherein the resin component is composed of unsaturated polyphenylene ether resin, SBS resin and maleimide resin; and the non-resin component comprises an initiator; and
wherein the adhesive layer is obtained by applying the adhesive composition dissolved in a solvent onto the surface of the conductive metal layer or the dielectric substrate layer in the form of a solution, or by applying to a release material and removing the release material after partially curing or completely curing.

The present application discloses that the resulting adhesive layer has good film-forming properties, adhesion and dielectric properties through the coordination of unsaturated polyphenylene ether resin, SBS resin and maleimide resin, so as to make the boards have high interlayer peel strength and low dielectric loss.

It should be noted that the resin component in the present application is a component used to form the polymer skeleton of the adhesive layer. The resin component in the present application comprises no other components than unsaturated polyphenylene ether resin, SBS resin and maleimide resin. The non-resin component is an auxiliary component used to form the adhesive layer, and it includes at least an initiator, and may also include auxiliary agents such as flame retardants and silane coupling agents. In the present application, the non-resin component does not comprise any resin material for forming the polymer skeleton of the adhesive layer.

As a preferred technical solution of the present application, the resin component is composed of 40-80 wt. % of unsaturated polyphenylene ether resin, 10-50 wt. % of SBS resin and 3-40 wt. % of maleimide resin.

In the present application, the unsaturated polyphenylene ether resin in the resin component is in an amount of 40 to 80 wt. %, e.g. 40 wt. %, 42 wt. %, 45 wt. %, 48 wt. %, 50 wt. %, 52 wt. %, 55 wt. %, 58 wt. %, 60 wt. %, 62 wt. %, 65 wt. %, 68 wt. %, 70 wt. %, 72 wt. %, 75 wt. %, 78 wt. % or 80 wt. %, etc.

The SBS resin in the resin component is in an amount of 10-50 wt. %, e.g. 10 wt. %, 12 wt. %, 15 wt. %, 18 wt. %, 20 wt. %, 22 wt. %, 25 wt. %, 28 wt. %, 30 wt. %, 32 wt. %, 35 wt. %, 38 wt. %, 40 wt. %, 42 wt. %, 45 wt. %, 48 wt. % or 50 wt. %, etc.

The maleimide resin in the resin component is in an amount of 3-40 wt. %, e.g. 3 wt. %, 5 wt. %, 8 wt. %, 10 wt. %, 12 wt. %, 15 wt. %, 18 wt. %, 20 wt. %, 22 wt. %, 25 wt. %, 28 wt. %, 30 wt. %, 32 wt. %, 35 wt. %, 38 wt. % or 40 wt. %, etc.

As a preferred technical solution of the present application, the unsaturated polyphenylene ether resin has the structural formula as shown in Formula (1).

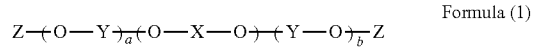

$$Z\text{---}(\text{O}\text{---}Y)_a\text{---}(\text{O}\text{---}X\text{---}\text{O})\text{---}(Y\text{---}\text{O})_b\text{---}Z \quad \text{Formula (1)}$$

in Formula (1), a and b are each independently an integer of 1-30 (e.g. 1, 3, 5, 8, 10, 12, 15, 18, 20, 22, 25, 28 or 30); Z has the structure shown in Formula (2) or (3); ⟶(O—Y⟶) has the structure shown in Formula (4); and ⟶(O—X—O⟶) has the structure shown in Formula (5);

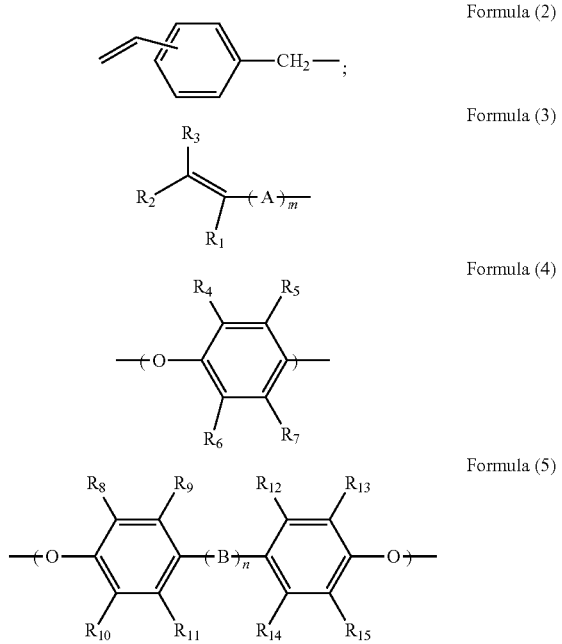

wherein in Formula (3), A is any one selected from the group consisting of an arylene group, a carbonyl group and an alkylene group having 1-10 carbon atoms (e.g. 1, 2, 3, 4, 5, 6, 7, 8, 9 or 10); m is an integer of 0-10 (e.g. 0, 1, 2, 3, 4, 5, 6, 7, 8, 9 or 10); and $R_1$-$R_3$ are each independently a hydrogen atom or an alkyl group having 1-10 carbon atoms (e.g. 1, 2, 3, 4, 5, 6, 7, 8, 9 or 10);

in Formula (4), $R_4$ and $R_6$ are each independently any one selected from the group consisting of a hydrogen atom, a halogen atom, a phenyl group and an alkyl group having 1-8 carbon atoms (e.g. 1, 2, 3, 4, 5, 6, 7 or 8); and $R_5$ and $R_7$ are each independently any one selected from the group consisting of a halogen atom, a phenyl group and an alkyl group having 1-8 carbon atoms (e.g. 1, 2, 3, 4, 5, 6, 7 or 8); and in Formula (5), $R_8$-$R_{15}$ are each independently any one selected from the group consisting of a hydrogen atom, a halogen atom, a phenyl group and an alkyl group having 1-8 carbon atoms (e.g. 1, 2, 3, 4, 5, 6, 7 or 8); B is a hydrocarbylene group having 20 carbon atoms or less (e.g. 1, 2, 3, 4, 5, 6, 7, 8, 10, 12, 15, 18 or 20), —O—,

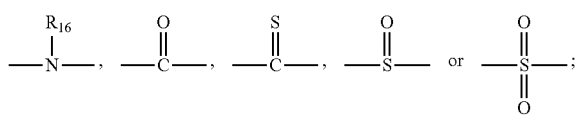

n is 0 or 1; and $R_{16}$ is a hydrogen atom or a hydrocarbon group having 1-10 carbon atoms.

As a preferred technical solution of the present application, the SBS resin has a number average molecular weight of 5,000-50,000, e.g. 5,000, 5,500, 6,000, 6,500, 7,000, 8,000, 9,000, 10,000, 15,000, 20,000, 25,000, 30,000, 35,000, 40,000, 45,000 or 50,000, etc., preferably 8,000-40,000, more preferably 15,000-30,000.

Unless otherwise specified, the number average molecular weight in the present application refers to the number average molecular weight measured by gel permeation chromatography.

In the present application, if the number average molecular weight of the SBS resin is too large, it is not easily dissolved, resulting in poor film-forming properties of the adhesive layer. If the number average molecular weight of the SBS resin is too small, it will reduce the adhesion of the adhesive layer.

Preferably, the side chain vinyl content of the SBS resin is 60-99 mol. %, further preferably 70-95 mol. %, more preferably 75-93 mol. %.

In the present application, the "side chain vinyl content" of the SBS resin refers to the mole percentage of the vinyl groups in the side chains of the SBS resin to the side chains.

Preferably, the styrene unit in the SBS resin is in an amount of 35-55 mol. %, e.g. 30 mol. %, 32 mol. %, 35 mol. %, 38 mol. %, 40 mol. %, 42 mol. %, 45 mol. %, 48 mol. %, 50 mol. %, 52 mol. %, 55 mol. %, 58 mol. % or 60 mol. %, etc., further preferably 40-50 mol. %.

Excessive styrene content will cause the adhesive layer to be too brittle and poor film formation. Low styrene content will lead to insufficient rigidity, and the adhesive layer will be sticky, making continuous operation difficult.

The high vinyl content contributes to the increase of crosslinking density such that the heat resistance of the adhesive layer is higher.

As a preferred technical solution of the present application, the maleimide resin has structural formula as shown in Formula (6):

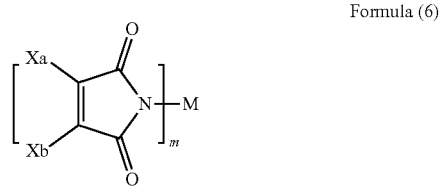

wherein, M is an m-valent aliphatic group or aromatic group; Xa and Xb are each independently any one selected from the group consisting of a hydrogen atom, a halogen atom and an aliphatic group; and m is an integer≥2 (e.g. 2, 3, 4, 5, 6, 7, 8, 10, 12, 13, 15, 18 or 20).

Preferably, in Formula (6), M is any one selected from the group consisting of

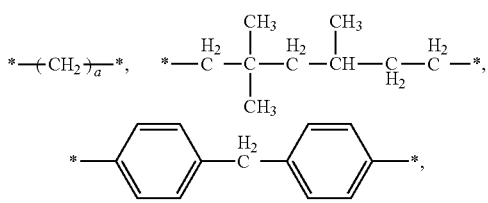

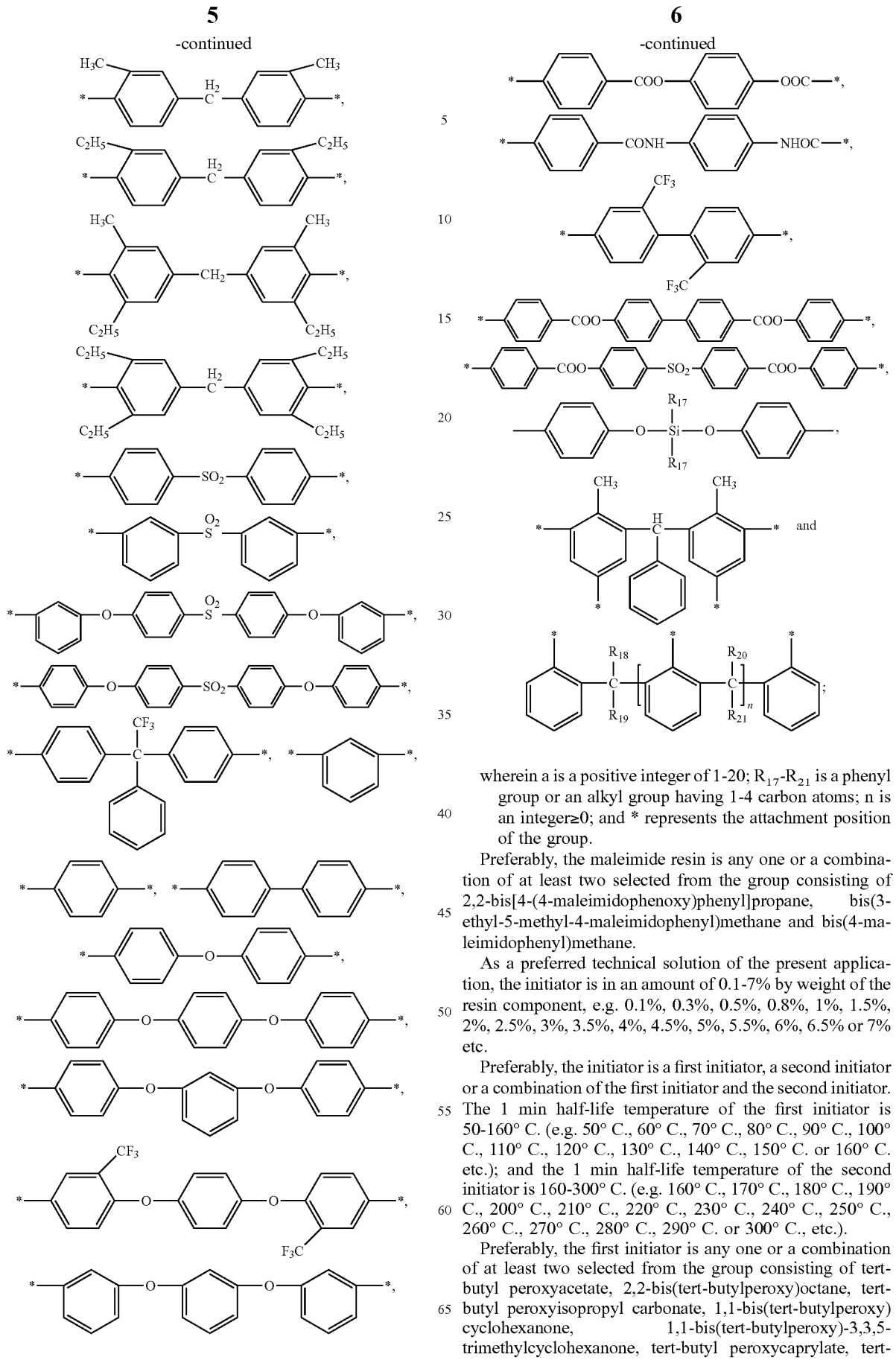

wherein a is a positive integer of 1-20; $R_{17}$-$R_{21}$ is a phenyl group or an alkyl group having 1-4 carbon atoms; n is an integer≥0; and * represents the attachment position of the group.

Preferably, the maleimide resin is any one or a combination of at least two selected from the group consisting of 2,2-bis[4-(4-maleimidophenoxy)phenyl]propane, bis(3-ethyl-5-methyl-4-maleimidophenyl)methane and bis(4-maleimidophenyl)methane.

As a preferred technical solution of the present application, the initiator is in an amount of 0.1-7% by weight of the resin component, e.g. 0.1%, 0.3%, 0.5%, 0.8%, 1%, 1.5%, 2%, 2.5%, 3%, 3.5%, 4%, 4.5%, 5%, 5.5%, 6%, 6.5% or 7% etc.

Preferably, the initiator is a first initiator, a second initiator or a combination of the first initiator and the second initiator. The 1 min half-life temperature of the first initiator is 50-160° C. (e.g. 50° C., 60° C., 70° C., 80° C., 90° C., 100° C., 110° C., 120° C., 130° C., 140° C., 150° C. or 160° C. etc.); and the 1 min half-life temperature of the second initiator is 160-300° C. (e.g. 160° C., 170° C., 180° C., 190° C., 200° C., 210° C., 220° C., 230° C., 240° C., 250° C., 260° C., 270° C., 280° C., 290° C. or 300° C., etc.).

Preferably, the first initiator is any one or a combination of at least two selected from the group consisting of tert-butyl peroxyacetate, 2,2-bis(tert-butylperoxy)octane, tert-butyl peroxyisopropyl carbonate, 1,1-bis(tert-butylperoxy)cyclohexanone, 1,1-bis(tert-butylperoxy)-3,3,5-trimethylcyclohexanone, tert-butyl peroxycaprylate, tert-butyl peroxyisobutyrate, disuccinate peroxide, di-m-toluoyl peroxide, xyloyl peroxide, diacetyl peroxide, cumyl peroxycaprylate, didecanoyl peroxide, dioctanoyl peroxide, didodecanoyl peroxide, bis(3,5,5-trimethylacetyl peroxide), tert-butyl peroxypivalate, tert-hexyl peroxytrimethyl acetate, tert-butyl peroxyneohexanoate, tert-hexyl peroxyneohexanoate, bis(3-methyl-3-methoxybutyl peroxyhydrocarbonate), tert-hexyl peroxyneodecanoate, tert-butyl peroxyneodecanoate, cumyl peroxyneohexanoate, bismethoxyisopropyl peroxyhydrocarbonate, ditetradecyl peroxyhydrocarbonate, diallyl peroxyhydrocarbonate, cumyl peroxyneodecanoate, di-n-propyl peroxyhydrocarbonate, bis(2-hydroxyethylhexyl peroxyhydrocarbonate), bis(2-ethylhexyl peroxyhydrocarbonate), di-n-butyl peroxyhydrocarbonate, diisobutyl peroxyhydrocarbonate, diisobutylene peroxide, diisopropyl peroxyhydrocarbonate and acetylcyclohexylsulfonyl peroxide.

Preferably, the second initiator is any one or a combination of at least two selected from the group consisting of tert-butyl hydroperoxide, tetramethylbutane peroxide, 2,5-dimethyl-2,5-bis(tert-butylperoxy)-hexyne, di-tert-butyl peroxide, a,a-bis(tert-butylperoxy-m-cumyl), 2,5-dimethyl-2,5-bis(tert-butylperoxy)hexane, tert-butylcumyl peroxide, tert-butylperoxyallyl hydrocarbonate, dicumyl peroxide (DCP), tert-butyl peroxybenzoate, di-tert-butyl peroxyisophthalate, n-butyl-4,4-bis(tert-butylperoxy)valerate, tert-butyl-peroxy(3,5,5-trimethyl acetate), tert-butyl peroxylaurate, 2,5-dimethyl-2,5-bis(dibenzoylperoxy)hexane and 2,2-bis(tert-butylperoxy)butane.

As a preferred technical solution of the present application, the non-resin component further includes a flame retardant.

Preferably, the flame retardant is in an amount of 10-40% by weight of the resin component, e.g. 10%, 12%, 15%, 18%, 20%, 22%, 25%, 28%, 30%, 32%, 35%, 38% or 40% and the like.

Preferably, the flame retardant is any one or a combination of at least two selected from the group consisting of decabromodiphenyl ether, ethyl-bis(tetrabromophthalimide), decabromodiphenylethane, tris(2,6-dimethylphenyl)phosphine, 10-(2,5-dihydroxyphenyl)-9,10-dihydro-9-oxo-10-phosphophene-10-oxide, 2,6-bis(2,6-dimethylbenzene) phosphobenzene and 10-phenyl-9,10-dihydro-9-oxo-10-phosphophene-10-oxide.

Preferably, the non-resin component further includes a silane coupling agent.

Preferably, the silane coupling agent is in an amount of 0.1-5% by weight of the resin component, e.g. 0.1%, 0.3%, 0.5%, 0.8%, 1%, 1.5%, 2%, 2.5%, 3%, 3.5%, 4%, 4.5% or 5% etc.

Preferably, the silane coupling agent is any one or a combination of at least two selected from the group consisting of vinyl trimethoxysilane, vinyl triethoxy silane, vinyl tri-tert-butylperoxy silane, vinyl triisopropoxy silane, vinyl triacetoxy silane, vinyl trisilane, vinyl triisopropoxy silane, propenyl trimethoxy silane, vinyl tri(2-methoxyethoxy) silane, γ-methacryloxypropyltrimethoxy silane, γ-methacryloxytriisopropoxy silane, triphenoxyvinyl silane and vinyltriisopropoxy silane.

By adding a silane coupling agent, it helps to further improve the adhesiveness of the adhesive layer and improve the peel strength of the circuit board.

Preferably, the non-resin component further comprises a crosslinking agent which is any one or a combination of at least two selected from the group consisting of triallyl isocyanurate, polytriallyl isocyanurate, triallyl cyanurate, trimethacrylic acid, diallyl phthalate and multifunctional acrylate;

Preferably, the crosslinking agent is in an amount of 3-40% by weight of the resin component, e.g. 3%, 5%, 8%, 10%, 12%, 15%, 18%, 20%, 22%, 25%, 28%, 30%, 32%, 35%, 38% or 40% and the like.

Preferably, the non-resin component further includes a filler.

Preferably, the filler is in an amount of 20-90% of the total weight of the adhesive composition, e.g. 20%, 25%, 30%, 35%, 40%, 45%, 50%, 55%, 60%, 65%, 70%, 75%, 80%, 85% or 90% and the like.

Preferably, the filler is any one or a combination of at least two selected from the group consisting of crystalline silica, amorphous silica, spherical silica, angular silica, hollow microspheres, titanium dioxide, boron nitride, aluminum nitride, silicon carbide, alumina, barium titanate, strontium titanate, magnesium titanate, calcium titanate, barium strontium titanate, barium calcium titanate, lead titanate, lead zirconate titanate, lead lanthanum zirconate titanate, barium lanthanum titanate, barium zirconium titanate, hafnium dioxide, lead magnesium niobate, barium magnesium niobate, lithium niobate, aluminum strontium tantalate, potassium tantalum niobate, barium strontium niobate, lead barium niobate, barium titanium niobate, strontium bismuth tantalate, bismuth titanate, barium rubidium titanate, copper titanate and lead titanate-lead magnesium niobite.

Preferably, the median particle size of the filler is 0.5-20 μm, e.g. 0.5 μm, 1 μm, 3 μm, 5 μm, 8 μm, 10 μm, 12 μm, 15 μm, 18 μm or 20 μm and the like, further preferably 1-15 μm, more preferably 4-10 μm.

Unless otherwise specified, the median particle size in the present application refers to the median particle size measured by a laser particle size analyzer.

Suitable dielectric substrate layers comprise resins with low polarity, low dielectric constant and low loss, and may be one or more selected from the group consisting of thermosetting resins based on such as polybutadiene, butadiene styrene copolymer, polyisoprene, polyetherimide (PEI), polybutadiene-polyisoprene copolymer, polyphenylene ether resin containing double bonds, and allylated polyphenylene ether resin. These materials exhibit the expected low dielectric constant and low loss characteristics. By adopting the present application, the copper peel strength of such materials can be significantly improved. Combinations of low-polarity resins and high-polarity resins can also be used, and non-limiting examples include epoxy resins and polyphenylene ethers, epoxy resins and polyetherimides, cyanate ester resins and polyphenylene ethers, as well as polybutadiene and polyethylene. The thermosetting polybutadiene and/or polyisoprene resin may be modified. For example, the resin may be hydroxyl-terminated, methacrylate-terminated, or carboxylate-terminated resin. Post-reaction resins can be used, such as epoxy-modified, maleic anhydride-modified, or urethane-modified butadiene or isoprene resins. For a suitable dielectric substrate layer, crosslinking agents, initiators, flame retardants, and fillers, etc. can also be added as needed.

Preferably, the conductive metal layer is copper foil.

Preferably, the surface roughness of the copper foil is less than 2 μm, e.g. may be 2 μm, 1.8 μm, 1.6 μm, 1.5 μm, 1.3 μm, 1.2 μm, 1 μm, 0.8 μm, 0.7 μm, 0.5 μm, 0.4 μm, 0.3 μm or 0.2 μm and the like, further preferably less than 0.7 μm.

Preferably, the dielectric constant at 1-10 GHz of the circuit material obtained after the dielectric circuit substrate layer and the adhesive layer are cured is below 3.8, e.g. may be 3.8, 3.7, 3.6, 3.5, 3.4, 3.2, 3.1, 3, 2.9, 2.8, 2.7, 2.6, 2.5, 2.4, 2.3 or 2.2 and the like; and the dielectric loss factor is below 0.007, e.g. may be 0.007, 0.0065, 0.006, 0.0055, 0.005, 0.0045, 0.004, 0.0035, 0.003, 0.0025 or 0.002 and the like.

Preferably, the grammage of the adhesive layer is 2-40 $g/m^2$, e.g. 2 $g/m^2$, 3 $g/m^2$, 5 $g/m^2$, 6 $g/m^2$, 8 $g/m^2$, 10 $g/m^2$, 12 $g/m^2$, 15 $g/m^2$, 18 $g/m^2$, 20 $g/m^2$, 22 $g/m^2$, 25 $g/m^2$, 28 $g/m^2$ or 30 $g/m^2$ and the like, further preferably 5-35 $g/m^2$, more preferably 10-30 $g/m^2$.

In the second aspect, the present application provides a method for forming a circuit board with low dielectric constant and low loss factor, comprising
  arranging an adhesive layer between a conductive metal layer and a dielectric substrate layer, wherein the adhesive layer is made of a material which comprises an adhesive composition comprising a resin component and a non-resin component;
  wherein the resin component is composed of unsaturated polyphenylene ether resin, SBS resin and maleimide resin; and the non-resin component comprises an initiator; and
  the adhesive layer is obtained by applying the adhesive composition dissolved in a solvent to the surface of the conductive metal layer or the dielectric substrate layer in the form of a solution, or applying to a release material and removing the release material after partially curing or completely curing.

In the third aspect, the present application provides a circuit board including the circuit material described in the first aspect.

In the fourth aspect, the present application provides a multilayer circuit board comprising the circuit material described in the first aspect.

As compared with the related technics, the present application has the following beneficial effects.

In the present application, it discloses that the resulting adhesive layer has good film-forming properties, adhesion and dielectric properties through the coordination of unsaturated polyphenylene ether resin, SBS resin and maleimide resin. The prepared circuit material has high interlayer peel strength and low dielectric loss, so as to meet the performance requirements of high-frequency boards.

DETAILED DESCRIPTION

The technical solutions of the present application will be further illustrated by specific embodiments below. Those skilled in the art should understand that the described embodiments are only to help understand the present application and should not be regarded as specific limitations to the present application.

The sources of raw materials used in the examples of the present application are listed as follows:
  Unsaturated Polyphenylene Ether Resin:
  Polyphenylene ether resin MMA-PPE (SA9000, SABIC);
  Polyphenylene ether resin St-PPE-2 (manufactured by Mitsubishi Chemical Corporation);
  Polyphenylene ether resin St-PPE-1 (manufactured by Mitsubishi Chemical Corporation).
  SBS Resin:
  D1118: Kraton Polymers;
  A1901: Kraton Polymers;
  D6670: Kraton Polymers.
  Butadiene Styrene Resin:
  TR2000: JSR Co. of Japan.
  Maleimide Resin:
  bis(3-ethyl-5-methyl-4-maleimidophenyl)methane (BMI-5100, manufactured by Daiwa Chemical Industry Co., Ltd.);
  2,2-bis[4-(4-maleimidophenoxy)phenyl]propane (BMI-4000, manufactured by Daiwa Chemical Industry Co., Ltd.);
  bis(4-maleimidophenyl)methane (BMI-1000, manufactured by Daiwa Chemical Industry Co., Ltd.);
  N-phenylmaleimide (Imilex-P, manufactured by Nippon Shokubai Co., Ltd.).
  Initiator:
  BPO: Dahe Oil & Fat Co., Ltd.;
  DCP: Shanghai Fangruida Chemical.

Examples 1-5 and Comparative Examples 1-8

Examples 1-5 and Comparative Examples 1-8 each provided a circuit material, and the preparation method is as follows.

(1) Prepreg
  S7136 prepreg, a thermosetting hydrocarbon-based substrate material, made by Shengyi Technology, Guangdong, China;
  or Synamic6 prepreg, a thermosetting hydrocarbon-based substrate material, made by Shengyi Technology, Guangdong, China.

(2) Preparation of Adhesive Layer:
  Unsaturated polyphenylene ether resin, SBS resin, maleimide resin, initiator, silane coupling agent and flame retardant were dissolved in xylene and mixed at room temperature to obtain a glue. The glue was coated onto a copper foil by using a coating machine, and then baked in an oven at 155° C. for 5 minutes to obtain an adhesive layer (having a thickness of 30 μm).

(3) Preparation of Circuit Material:
  Several sheets of the above-mentioned prepregs and the copper foil with an adhesive layer were stacked neatly (the adhesive layer was between the prepreg and the copper foil), laminated and cured in a press at 210° C. to obtain a circuit material.

Comparative Example 9

It discloses providing a circuit material, and it differs from Example 1 in replacing the raw material SBS resin of the adhesive layer with styrene butadiene resin.

The types and amounts of the raw materials of the adhesive layers in Examples 1-5 and Comparative Examples 1-9 above are shown in Tables 1 and 2 below.

The dielectric constant, dielectric loss factor, peel strength and float soldering resistance of the circuit materials provided in Examples 1-5 and Comparative Examples 1-9 above were tested by the following methods.

(1) Dielectric constant (Dk) and dielectric loss factor (Df): tested in accordance with SPDR method;
(2) Peel strength: tested according to IPC-TM-650, 2.4.8 method;
(3) Float soldering resistance: tested in accordance with IPC650-2.4.13.1 method.

The results of the above test are shown in Tables 1 and 2.

TABLE 1

| | Items | | Example 1 | Example 2 | Example 3 | Example 4 | Example 5 | Com. Example 1 | Com. Example 2 |
|---|---|---|---|---|---|---|---|---|---|
| Raw materials of the adhesive layer | SBS resin | Type | D1118 | A1901 | D6670 | D1118 | D1118 | D1118 | A1901 |
| | | Amount/g | 50 | 10 | 30 | 17 | 10 | 50 | 10 |
| | Maleimide | Type | BMI-5100 | BMI-4000 | Imilex-P | BMI-1000 | BMI-5100 | BMI-5100 | BMI-4000 |
| | | Amount/g | 10 | 10 | 20 | 3 | 40 | 30 | 3 |
| | PPO Resin | Type | SA9000 | St-PPE-2 | St-PPE-1 | SA9000 | SA9000 | SA9000 | St-PPE-2 |
| | | Amount/g | 40 | 80 | 50 | 80 | 50 | 20 | 87 |
| | Initiator | Type | BPO | DCP | DCP | BPO | BPO | BPO | DCP |
| | | Amount/g | 0.1 | 7 | 6 | 0.1 | 0.1 | 0.1 | 7 |
| | Flame retardant | Type | — | — | — | Decabromodiphenylethane | — | — | — |
| | | Amount/g | — | — | — | 20 | — | — | — |
| | Silane coupling agent | Type | — | — | — | — | Vinyl trimethoxysilane | — | — |
| | | Amount/g | — | — | — | — | 5 | — | — |
| Prepreg | / | Type | S7136 | S7136 | Synamic6 | S7136 | S7136 | S7136 | S7136 |
| | / | Amount/g | 4 sheets | 4 sheets | 4 sheets | 4 sheets | 4 sheets | 4 sheets | 4 sheets |
| Performance | Dk (10 GHz) | | 3.36 | 3.68 | 3.54 | 3.58 | 3.67 | 3.38 | — |
| | Df (10 GHz) | | 0.0029 | 0.0038 | 0.0036 | 0.0036 | 0.0034 | 0.0027 | — |
| | Peel strength (N/mm) | | 1.09 | 1.37 | 1.23 | 1.30 | 1.30 | 0.71 | — |
| | Float soldering resistance 288° C., No layering, no foaming | | Higher than 5 min | Higher than 5 min | Higher than 5 min | Higher than 5 min | Higher than 5 min | Higher than 5 min | — |

TABLE 2

| | Items | | Com. Example 3 | Com. Example 4 | Com. Example 5 | Com. Example 6 | Com. Example 7 | Com. Example 8 | Com. Example 9 |
|---|---|---|---|---|---|---|---|---|---|
| Raw materials of the adhesive layer | SBS resin | Type | D1118 | D1118 | A1901 | D1118 | D1118 | A1901 | TR2000 |
| | | Amount/g | 19 | 10 | 3 | 55 | 50 | 10 | 50 |
| | Maleimide | Type | BMI-1000 | BMI-5100 | BMI-4000 | BMI-5100 | BMI-5100 | BMI-4000 | BMI-5100 |
| | | Amount/g | 1 | 50 | 17 | 5 | 10 | 10 | 10 |
| | PPO Resin | Type | SA9000 | SA9000 | St-PPE-2 | SA9000 | SA9000 | St-PPE-2 | SA9000 |
| | | Amount/g | 80 | 40 | 80 | 40 | 40 | 80 | 40 |
| | Initiator | Type | BPO | BPO | DCP | BPO | BPO | DCP | BPO |
| | | Amount/g | 0.1 | 0.1 | 7 | 0.1 | 0.05 | 15 | 0.1 |
| | Flame retardant | Type | Decabromodiphenylethane | — | — | — | — | — | — |
| | | Amount/g | 20 | — | — | — | — | — | — |
| | Silane coupling agent | Type | — | Trimethoxysilane vinyl silane coupling agent | — | — | — | — | — |
| | | Amount/g | — | 5 | — | — | — | — | — |
| Prepreg | / | Type | S7136 | Synamic6 | S7136 | S7136 | S7136 | S7136 | S7136 |
| | / | Amount/g | 4 sheets | 4 sheets | 4 sheets | 4 sheets | 4 sheets | 4 sheets | 4 sheets |
| Performance | Dk (10 GHz) | | 3.57 | 3.68 | 3.73 | — | 3.36 | 3.72 | — |
| | Df (10 GHz) | | 0.0036 | 0.0033 | 0.0053 | — | 0.0029 | 0.0047 | — |
| | Peel strength (N/mm) | | 0.75 | 1.29 | 1.40 | — | 1.09 | 1.41 | — |
| | Float soldering resistance 288° C., No layering, no foaming | | Less than 5 min | Less than 10 s | Higher than 5 min | — | Less than 10 s | Less than 10 s | — |

It can be seen from the test results in Tables 1 and 2 that the circuit materials provided by the examples of the present application have the peel strength reaching 1.09-1.37 N/mm, the dielectric constant (10 GHz) of 3.36 to 3.68, and the dielectric loss factor (10 GHz) of 0.0029-0.0038, and have good dielectric properties and peel strength, so as to meet the performance requirements of high-frequency boards.

The content of the unsaturated PPO resin used in Comparative Example 1 was less than 40 wt. %. As compared with Example 1, the peel strength of the obtained circuit material was reduced to only 0.71N/mm.

The content of the unsaturated PPO resin used in Comparative Example 2 was greater than 80 wt. %. As compared with Example 2, the glue solution has poor film-forming properties, and no qualified film could be prepared.

In Comparative Example 3, the content of maleimide used was less than 3 wt. %. As compared with Example 4, the peel strength of the obtained circuit material was reduced to only 0.75 N/mm.

In Comparative Example 4, the content of maleimide used was greater than 40 wt. %. As compared with Example 5, the float soldering of the obtained circuit material was less than 10 s, and the heat resistance was reduced.

In Comparative Example 5, the content of SBS resin used was less than 10 wt. %. As compared with Example 2, the dielectric loss factor of the obtained circuit material was as high as 0.0053, and the dielectric properties became worse.

The content of SBS resin used in Comparative Example 6 was greater than 50 wt. %. As compared with Example 1, the viscosity of the glue solution was too high to prepare a film.

The initiator content used in Comparative Example 7 was less than 0.1 wt. %. As compared with Example 1, the float soldering of the obtained circuit material was less than 10 seconds, and the heat resistance was reduced.

The initiator content used in Comparative Example 8 was greater than 7 wt. %. As compared with Example 2, the float soldering of the obtained circuit material was less than 10 s, and the heat resistance was reduced.

In Comparative Example 9, the styrene-butadiene resin was used instead of SBS resin. As compared with Example 1, the glue solution had poor film-forming properties, and no qualified film could be prepared.

The applicant declares that the above descriptions are only specific implementations of the present application, but the protection scope of the present application is not limited thereto. Those skilled in the art should understand that any changes or replacements that can be easily conceived by those skilled in the art within the technical scope of the present application fall within the protection scope and disclosure of the present application.

What is claimed:

1. A circuit material, comprising a conductive metal layer and a dielectric substrate layer, and an adhesive layer arranged between the conductive metal layer and the dielectric substrate layer,
   wherein the adhesive layer is made of a material which comprises an adhesive composition; wherein the adhesive composition comprises a resin component and a non-resin component;
   wherein the resin component is composed of unsaturated polyphenylene ether resin, SBS resin and maleimide resin; and the non-resin component comprises an initiator;
   the adhesive layer is obtained by applying the adhesive composition dissolved in a solvent onto the surface of the conductive metal layer or the dielectric substrate layer in the form of a solution, or by applying to a release material and removing the release material after partially curing or completely curing;
   wherein the SBS resin has a number average molecular weight of 5,000-50,000, the SBS resin has a side chain vinyl content of 60-99 mol. %, the SBS resin has a styrene unit content of 35-55 mol. %;
   wherein the circuit material obtained by curing the dielectric circuit substrate layer and the adhesive layer has dielectric constant at 1-10 GHz of 3.36 to 3.68, and dielectric loss factor of 0.0029-0.0038; and
   wherein the adhesive layer has a grammage of 2-40 g/m².

2. The circuit material of claim 1, wherein the resin component is composed of 40-80 wt. % of unsaturated polyphenylene ether resin, 10-50 wt. % of SBS resin and 3-40 wt. % of maleimide resin.

3. The circuit material of claim 1, wherein the unsaturated polyphenylene ether resin has the structural formula as shown in Formula (1)

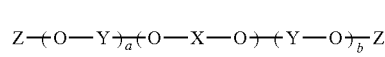

Formula (1)

wherein a and b are each independently an integer of 1-30; Z has the structure shown in Formula (2) or (3); $-\!(\!O\!-\!Y\!)\!-$ has the structure shown in Formula (4); and $-\!(\!O\!-\!X\!-\!O\!)\!-$ has the structure shown in Formula (5)

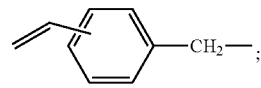

Formula (2)

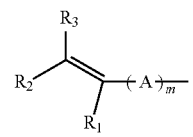

Formula (3)

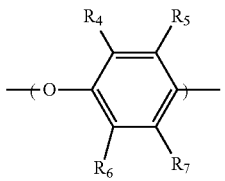

Formula (4)

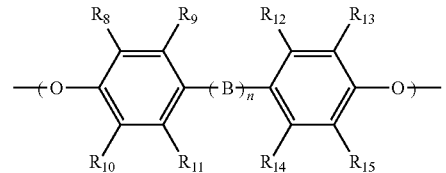

Formula (5)

in Formula (3), A is any one selected from the group consisting of an arylene group, a carbonyl group and an alkylene group having 1-10 carbon atoms; m is an integer of 0-10; and $R_1$-$R_3$ are each independently a hydrogen atom or an alkyl group having 1-10 carbon atoms;

in Formula (4), $R_4$ and $R_6$ are each independently any one selected from the group consisting of a hydrogen atom, a halogen atom, a phenyl group and an alkyl group having 1-8 carbon atoms; and $R_5$ and $R_7$ are each independently any one selected from the group consisting of a halogen atom, a phenyl group and an alkyl group having 1-8 carbon atoms; and in Formula (5), $R_8$-$R_{15}$ are each independently any one selected from the group consisting of a hydrogen atom, a halogen atom, a phenyl group and an alkyl group having 1-8 carbon atoms; B is a hydrocarbylene group having 20 carbon atoms or less,

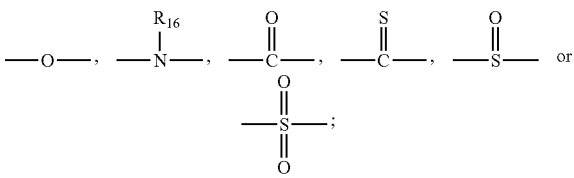

n is 0 or 1; and $R_{16}$ is a hydrogen atom or a hydrocarbon group having 1-10 carbon atoms.

4. The circuit material of claim 1, wherein the SBS resin has a number average molecular weight of 15,000-30,000.

5. The circuit material of claim 1, wherein the SBS resin has a side chain vinyl content of 75-93 mol. %.

6. The circuit material of claim 1, wherein the maleimide resin has the structural formula as shown in Formula (6)

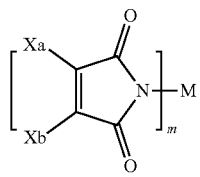

Formula (6)

wherein M is an m-valent aliphatic group or an aromatic group; Xa and Xb are each independently any one selected from the group consisting of a hydrogen atom, a halogen atom and an aliphatic group; and m is an integer≥2.

7. The circuit material of claim 1, wherein M is any one selected from the group consisting of

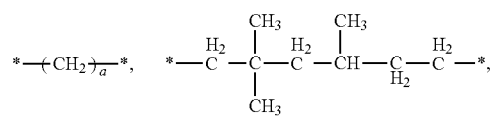

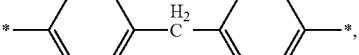

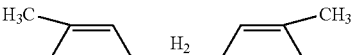

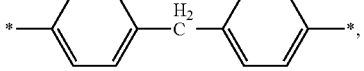

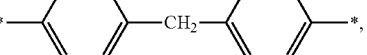

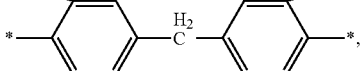

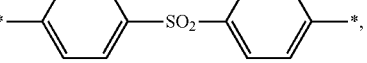

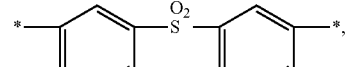

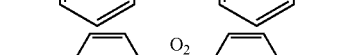

-continued

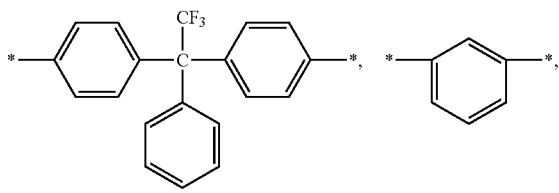

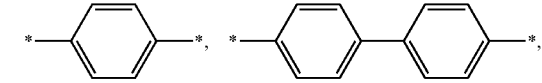

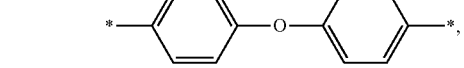

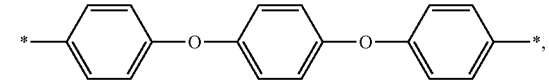

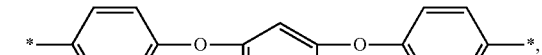

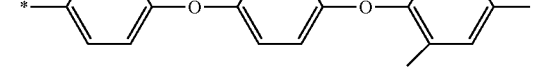

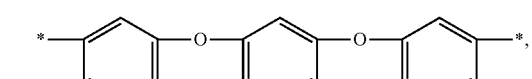

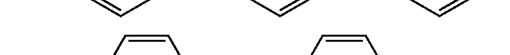

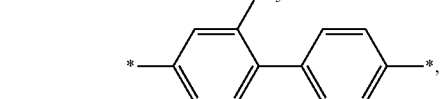

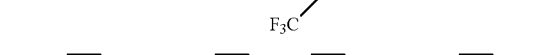

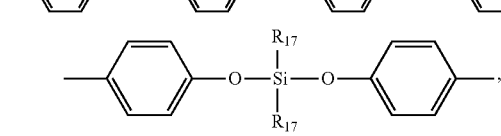

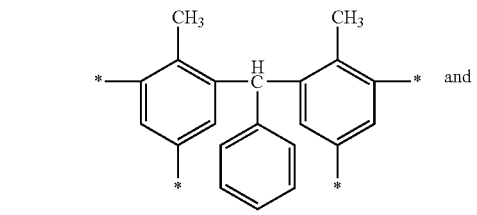 and

-continued

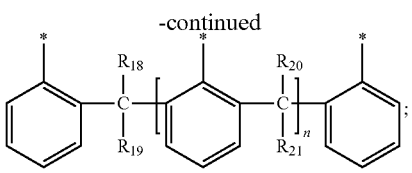

wherein a is a positive integer of 1-20; $R_{17}$-$R_{21}$ is a phenyl group or an alkyl group having 1-4 carbon atoms; n is an integer≥0; and * represents the attachment position of the group.

8. The circuit material of claim 1, wherein the initiator is in an amount of 0.1-7% by weight of the resin component.

9. The circuit material of claim 8, wherein the initiator is a first initiator, a second initiator, or a combination of the first initiator and the second initiator; the first initiator has a 1 min half-life temperature of 50-160° C., and the second initiator has a 1 min half-life temperature of 160-300° C.

10. The circuit material of claim 9, wherein the first initiator is any one or a combination of at least two selected from the group consisting of tert-butyl peroxyacetate, 2,2-bis(tert-butylperoxy)octane, tert-butyl peroxyisopropyl carbonate, 1,1-bis(tert-butylperoxy)cyclohexanone, 1,1-bis(tert-butylperoxy)-3,3,5-trimethylcyclohexanone, tert-butyl peroxycaprylate, tert-butyl peroxyisobutyrate, disuccinate peroxide, di-m-toluoyl peroxide, xyloyl peroxide, diacetyl peroxide, cumyl peroxycaprylate, didecanoyl peroxide, dioctanoyl peroxide, didodecanoyl peroxide, bis(3,5,5-trimethylacetyl peroxide), tert-butyl peroxypivalate, tert-hexyl peroxytrimethyl acetate, tert-butyl peroxyneohexanoate, tert-hexyl peroxyneohexanoate, bis(3-methyl-3-methoxybutyl peroxyhydrocarbonate), tert-hexyl peroxyneodecanoate, tert-butyl peroxyneodecanoate, cumyl peroxyneohexanoate, bismethoxyisopropyl peroxyhydrocarbonate, ditetradecyl peroxyhydrocarbonate, diallyl peroxyhydrocarbonate, cumyl peroxyneodecanoate, di-n-propyl peroxyhydrocarbonate, bis(2-hydroxyethylhexyl peroxyhydrocarbonate), bis(2-ethylhexyl peroxyhydrocarbonate), di-n-butyl peroxyhydrocarbonate, diisobutyl peroxyhydrocarbonate, diisobutylene peroxide, diisopropyl peroxyhydrocarbonate and acetylcyclohexylsulfonyl peroxide; and
wherein the second initiator is any one or a combination of at least two selected from the group consisting of tert-butyl hydroperoxide, tetramethylbutane peroxide, 2,5-dimethyl-2,5-bis(tert-butylperoxy)-hexyne, di-tert-butyl peroxide, a,a-bis(tert-butylperoxy-m-cumyl), 2,5-dimethyl-2,5-bis(tert-butylperoxy)hexane, tert-butylcumyl peroxide, tert-butylperoxyallyl hydrocarbonate, dicumyl peroxide (DCP), tert-butyl peroxybenzoate, di-tert-butyl peroxyisophthalate, n-butyl-4,4-bis(tert-butylperoxy)valerate, tert-butyl-peroxy(3,5,5-trimethyl acetate), tert-butyl peroxylaurate, 2,5-dimethyl-2,5-bis(dibenzoylperoxy)hexane and 2,2-bis(tert-butylperoxy)butane.

11. The circuit material of claim 1, wherein the non-resin component further comprises a flame retardant; wherein the flame retardant is in an amount of 10-40% by weight of the resin component.

12. The circuit material of claim 1, wherein the non-resin component further comprises a silane coupling agent; wherein the silane coupling agent is in an amount of 0.1-5% by weight of the resin component.

13. The circuit material of claim 1, wherein the non-resin component further comprises a crosslinking agent which is any one or a combination of at least two selected from the group consisting of triallyl isocyanurate, polytriallyl isocyanurate, triallyl cyanurate, trimethacrylic acid, diallyl phthalate and multifunctional acrylate; wherein the crosslinking agent is in an amount of 3-40% by weight of the resin component.

14. The circuit material of claim 1, wherein the non-resin component further comprises a filler, the filler is in an amount of 20-90% of the total weight of the adhesive composition.

15. A circuit board comprising the circuit material of claim 1.

16. A multilayer circuit board comprising the circuit material of claim 1.

* * * * *